United States Patent
Radi et al.

(10) Patent No.: US 10,087,527 B2
(45) Date of Patent: Oct. 2, 2018

(54) METHOD OF FABRICATING SUBSTRATE STRUCTURE AND SUBSTRATE STRUCTURE FABRICATED BY THE SAME METHOD

(71) Applicant: Wistron NeWeb Corp., Hsinchu (TW)

(72) Inventors: Babak Radi, Hsinchu (TW); Shih-Hong Chen, Hsinchu (TW); Yu-Fu Kuo, Hsinchu (TW); Chun-Lin Chen, Hsinchu (TW); Jing-Wen Chen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 171 days.

(21) Appl. No.: 14/265,369

(22) Filed: Apr. 30, 2014

(65) Prior Publication Data
US 2015/0315708 A1    Nov. 5, 2015

(51) Int. Cl.
*H01L 23/528* (2006.01)
*C23C 18/16* (2006.01)
(Continued)

(52) U.S. Cl.
CPC .......... *C23C 18/1605* (2013.01); *B32B 3/02* (2013.01); *B32B 3/30* (2013.01); *B32B 15/043* (2013.01);
(Continued)

(58) Field of Classification Search
CPC ..... C23C 18/1605; C23C 18/182; B32B 3/02; B32B 3/30; B32B 15/043; B32B 15/08;
(Continued)

(56) References Cited

U.S. PATENT DOCUMENTS 5,104,480 A    4/1992  Wojnarowski et al.
6,162,652 A *  12/2000  Dass .................. G01R 31/2884
                                                257/E21.508
(Continued)

FOREIGN PATENT DOCUMENTS

CN    102308678    1/2012

OTHER PUBLICATIONS

Xia et al., "Microcontact Printing of Alkanethiols on Copper and Its Application in Microfabrication", Chem. Mater., 1996, vol. 8, No. 3, pp. 601-603.*
(Continued)

*Primary Examiner* — Jonathan C Langman
(74) *Attorney, Agent, or Firm* — JCIPRNET

(57) ABSTRACT

The present disclosure is directed to a method of fabricating a substrate structure and a substrate structure fabricated by the same method. The method would include forming a first metal layer directly on a base, forming a first protective layer directly on the first metal layer, forming a second protective layer by using a compound comprising a thiol group directly on the first protective layer, patterning the second protective layer to form a pattern having an opening exposing the first protective layer, and forming a second metal layer within the opening of the second protective layer and directly on the first protective layer. The substrate structure would include a base, a first metal layer, a first protective layer, a second protective layer, and a second metal layer.

20 Claims, 3 Drawing Sheets

(51) Int. Cl.

| | | |
|---|---|---|
| *C23C 18/18* | (2006.01) | |
| *H01L 23/532* | (2006.01) | |
| *H01L 23/522* | (2006.01) | |
| *H01L 23/498* | (2006.01) | |
| *G03F 7/20* | (2006.01) | |
| *H01L 23/06* | (2006.01) | |
| *B32B 15/04* | (2006.01) | |
| *B32B 15/08* | (2006.01) | |
| *B32B 15/20* | (2006.01) | |
| *B32B 3/02* | (2006.01) | |
| *B32B 3/30* | (2006.01) | |
| *H05K 3/10* | (2006.01) | |
| *H05K 3/24* | (2006.01) | |
| *H05K 1/09* | (2006.01) | |
| *H05K 3/00* | (2006.01) | |

(52) U.S. Cl.
CPC .............. *B32B 15/08* (2013.01); *B32B 15/20* (2013.01); *C23C 18/182* (2013.01); *G03F 7/202* (2013.01); *H01L 23/06* (2013.01); *H01L 23/49838* (2013.01); *H01L 23/528* (2013.01); *H01L 23/5223* (2013.01); *H01L 23/5227* (2013.01); *H01L 23/5228* (2013.01); *H01L 23/53204* (2013.01); *H01L 23/53228* (2013.01); *H01L 23/53233* (2013.01); *H01L 23/53242* (2013.01); *H05K 3/107* (2013.01); *H05K 3/243* (2013.01); *B32B 2255/06* (2013.01); *B32B 2255/205* (2013.01); *B32B 2255/24* (2013.01); *B32B 2457/00* (2013.01); *H01L 2924/00* (2013.01); *H01L 2924/0002* (2013.01); *H05K 1/09* (2013.01); *H05K 3/0026* (2013.01); *H05K 2201/0338* (2013.01); *H05K 2203/072* (2013.01); *Y10T 428/12361* (2015.01); *Y10T 428/24331* (2015.01)

(58) Field of Classification Search
CPC ................ B32B 15/20; B32B 2255/06; B32B 2255/205; B32B 2255/24; B32B 2457/00; G03F 7/202; H01L 23/06; H01L 2924/0002; H01L 23/5223; H01L 23/53233; H01L 23/53228; H01L 23/53204; H01L 23/528; H01L 23/5228; H01L 23/5227; H01L 23/53242; H01L 23/49838; H01L 2924/00; H05K 3/243; H05K 3/107; H05K 1/09; H05K 3/0026; H05K 2201/0338; H05K 2203/072; Y10T 428/12361; Y10T 428/24331
See application file for complete search history.

(56) References Cited

U.S. PATENT DOCUMENTS

| | | | |
|---|---|---|---|
| 9,385,084 B2* | 7/2016 | Radi | H01L 23/5223 |
| 2001/0033020 A1* | 10/2001 | Stierman | H01L 23/53228 |
| | | | 257/737 |
| 2003/0089868 A1* | 5/2003 | Ito | H01L 23/525 |
| | | | 251/100 |
| 2004/0102050 A1* | 5/2004 | Delamarche | B81C 1/0046 |
| | | | 438/734 |
| 2007/0170064 A1* | 7/2007 | Pesika | B82Y 30/00 |
| | | | 205/118 |
| 2008/0283405 A1* | 11/2008 | Pesika | B82Y 30/00 |
| | | | 205/135 |
| 2010/0151263 A1* | 6/2010 | Abys et al. | 428/457 |
| 2010/0291303 A1* | 11/2010 | Abys et al. | 427/343 |
| 2011/0292622 A1 | 12/2011 | Hovestad et al. | |

OTHER PUBLICATIONS

"Office Action of China Counterpart Application," dated May 18, 2017, p. 1-p. 10.

\* cited by examiner

METHOD OF FABRICATING SUBSTRATE STRUCTURE AND SUBSTRATE STRUCTURE FABRICATED BY THE SAME METHOD

TECHNICAL FIELD

The present disclosure is directed to a method of fabricating a substrate structure and a substrate structure fabricated by the same method.

BACKGROUND

Conventionally, in order to form structures on a substrate by using a process that minimizes manual machining, such process may involve techniques such as photolithography, electroplating, etching, and so forth. Photolithography has been a reliable method used to form structural patterns on a substrate, and a process of using photolithography during fabrication to pattern parts of a substance deposited on a substrate would typically involve one or more photo masks having a specific geometric pattern which would be transferred from a photo mask to a light-sensitive photoresist. After a period of exposure to light, chemical or high intensity photon treatments would be applied to remove a part of the light-sensitive photoresist to develop a patterned exposure into which a material could then be deposited on the material underneath the photo resist.

However, such process would involve numerous expensive machines and masks as well as extremely clean operating conditions so that the overall costs of manufacturing would be increased. Also, in order to secure a photoresist onto a substrate, a polymeric resin such as epoxy would need to be sprayed on parts on a bonding surface before curing. Such process would involve additional chemicals and extra steps. Furthermore, even though electroplating has been a popular process used to deposit material into exposed parts of a photo resist on the material underneath the photo resist, conventional electroplating would also incur costs because of the use of electroplating equipment, electrodes, plating solutions, and etc. . . . . .

Therefore, there could be a more efficient and cost effective way of developing patterned structures on a substrate than above mentioned conventional practices.

SUMMARY OF THE DISCLOSURE

The present disclosure is directed to a method of fabricating a substrate structure and a substrate structure fabricated by the same method.

According to an exemplary embodiment, the method of fabricating a substrate structure would include the steps of forming a first metal layer directly on a base, forming a first protective metal layer directly on the first metal layer, forming a second protective layer by using a compound comprising a thiol group directly on the first protective layer, patterning the second protective layer to form a pattern having an opening exposing the first protective layer, and forming a second metal layer within the opening of the second protective layer and directly on the first protective layer.

In one of the exemplary embodiment, the present disclosure is directed to a substrate structure which includes at least but not limited to a base, a first metal layer disposed on the base, a first protective layer disposed on the first metal layer, a second protective layer which comprises a thiol compound is disposed on the first protective layer and has a pattern which comprises an opening exposing the first protective layer, and a second metal layer disposed within the opening and is disposed on the first protective layer.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
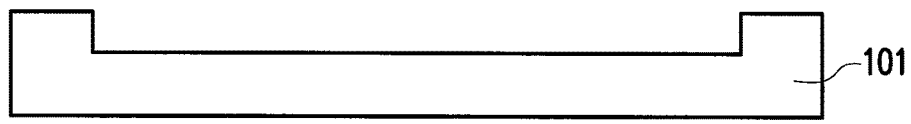
FIG. 1A illustrates a first step of fabricating a substrate structure in accordance with an exemplary embodiment of the present disclosure.

Reference will now be made in detail to the present exemplary embodiments of the disclosure, examples of which are illustrated in the accompanying drawings. Wherever possible, the same reference numbers are used in the drawings and the description to refer to the same or like parts.

The present disclosure proposes a method of fabricating a patterned structure by using a combination of chemical and laser treatment to form the patterned layer onto a substrate. The substrate could be, for example, metallic, and the metal used for the substrate could be Nickel for example. Under conventional methods, fixtures, equipment, and masks would typically be required to cover and prevent an area that should not be exposed to a pattern forming agent. However, the proposed method does not require masks and associated fixtures and equipment as the pattern forming protective layer would be made by a chemical compound. One or more openings of the protective layer could be formed and cleaned by laser.

The pattern forming protective layer as aforementioned could be formed by a chemical compound known as thiol or a thiol derivative. The thiol compound may have several variants such as Octadecanethiol, Nonanethiol, 1-Hexadecanethiol, 1-Butanethiol, tert-Nonyl mercaptan, Benzyl mercaptan, and Thiophenol. The protective layer could be formed with one or a combination of such variants. The chemical solution that includes thiol or thiol derivative as aforementioned is referred to as a thiol compound in the present disclosure.

In one of the exemplary embodiment, the chemical compound that forms the protective layer could be mostly the thiol compound having some non-reactive elements and impurities. The thiol compound is highly flexible during mass production and does not require curing and further processes after curing as required by resins. The thiol compound is laser-able or laser sensitive such that the thiol compound could easily be removed and cleaned by laser treatment. Also the thiol compound may adhere well to a subsequent layer such as a diffusion barrier layer between metal substrate and metallization solution. For example, the thiol compounds would chemically bind very well with Nickel which not only servers as a diffusion barrier layer prevents of metals adhered to the Nickel layer but also would prevent oxidation of the Nickel layer. Therefore, by applying a general 2D or 3D laser to a chemical protective layer that includes the thiol compound, complex patterns could be developed in the protective layer in forms of openings of the protective layer so that a metal could be disposed into openings of the protective layer by using electroless plating. Such technique would enable a very high rate of production as well as high resolution assuming that a high resolution laser with small spot size could be used.

By using the proposed method, a, substrate structure could be developed. The substrate structure would include at least but not limited to a base, a first metal layer, a first protective metal layer, a second protective layer, and a second metal layer. A first metal layer would be disposed on the base. The first protective layer would be disposed on the first metal layer to serve as a diffusion barrier layer. The second protective layer would be the thiol compound. By etching the second protective layer using a general laser to form a pattern, the patterned second protective layer would contain one or more openings by which a second metal layer could be disposed into the openings to be adhered to the first protective layer. The second metal could be disposed into the openings via an electroless bath. The substrate structure could be used for a variety of mechanical or electrical structures such as a connector, an antenna, and so forth. However, the substrate structure of present disclosure is not limited to any specific application as the substrate structure could be used for any structures and any applications which require a metal pattern formed on a substrate.

The proposed method would have the following advantages. First, the proposed method could form any complex structure or geometry by a metal layer as long as laser etching into such pattern is feasible. Second, all the required equipment, fixture, and electroless bath could easily be obtained in a low cost manner to implement the proposed process which could also be automated for mass production. Third, the proposed method is faster to implement than the conventional method involving photolithography and electroplating. Fourth, the patterned metal layer is only needed in the patterned opening of the second protective layer so that a considerable amount of saving could be accomplished. Fifth, spraying of polymeric resin such as epoxy on the first protective layer before sending for curing is not necessary as the second protective layer could be disposed on the first protective layer by immersion into a solution that includes the thiol compound. Sixth, when the thiol compound is used as mold to form the patterned metal layer, the dimension of the mold and the subsequently deposited layers would not change because of the formation of the mono-layers of thiol; whereas when a technique involving an application of resin is used, the thickness of the mold would get bigger. Consequently, the changing dimension of the mold and the patterned metal layer could be problematic when the substrates is assembled with other parts.

An exemplary embodiment is provided by FIG. 1A~1F and the corresponding written descriptions of these figures in order to further elucidate the proposed concept. Referring to FIG. 1A, a substrate or a base 101 could be used as a foundation and as a part of a substrate structure. The base 101 could be rigid or flexible. The base 101 could be made of polymer; however, but the present disclosure is not limited to polymer as any metallic or non-metallic materials could be used for the base 101 as long as the base 101 could provide adequate stability for the substrate structure and for a subsequent layer to adhere onto. Also according to FIG. 1A, a recess portion is formed in the base 101 by applying laser etching to remove a part of the base 101, and subsequently a first metal layer could be disposed into the recess portion. However, the formation of the recess portion is optional as a next layer could be disposed on a surface of the base 101 without the recess portion.

Figure 1B:
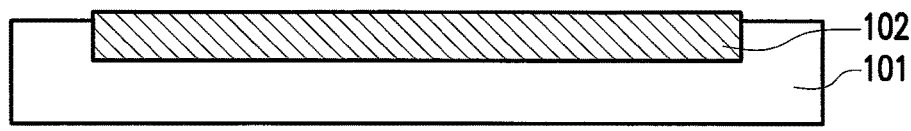
FIG. 1B illustrates forming a first metal layer on a base in accordance with an exemplary embodiment of the present disclosure.

Next, a first metal layer 102 could be formed on a surface of the base 101 as illustrated by FIG. 1B. For example, assuming that the base 101 has been laser etched to form a recess, a first metal layer 102, which could be copper for example, could be disposed on the surface of the base 101 by electroplating. For example, suppose that the proposed substrate structure is to be used as an antenna, the first metal layer could be copper which serves as a ground for the antenna. However, the use of copper is merely exemplary and should not be construed as a limitation for the present disclosure. The first metal layer could also be gold, silver, or nickel.

Figure 1C:
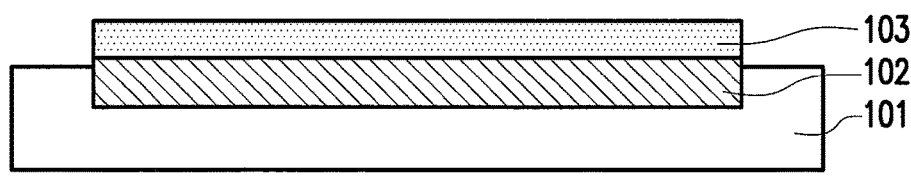
FIG. 1C illustrates forming a first protective layer on the first metal layer in accordance with an exemplary embodiment of the present disclosure.

FIG. 1C illustrates the formation of a first protective layer 103 disposed on the first metal layer 102 in accordance with an exemplary embodiment of the present disclosure. Since a second metallic layer would eventually be the patterned layer, a first protective layer 103 would be require to prevent potential diffusion between the first metal layer 102 and the second metal layer. Also the first protective layer 103 would prevent oxidation of the surfaces of the first metal layer 102. Therefore, the first protective layer 103 would be disposed onto the first metal layer 102 by using, for example, electroless plating. However, a conventional technique such as electroplating or sputtering could also be used as long as the first protective metal layer 103 could adhere to the first metal layer 102. The first protective layer 103 could be nickel which would serve as an excellent diffusion barrier between two metal layers; however, the first protective layer 103 could also be silver or any other materials as long as the materials used as the first protective layer 103 could serve as a diffusion barrier and prevent oxidation of the metal layers.

Figure 1D:
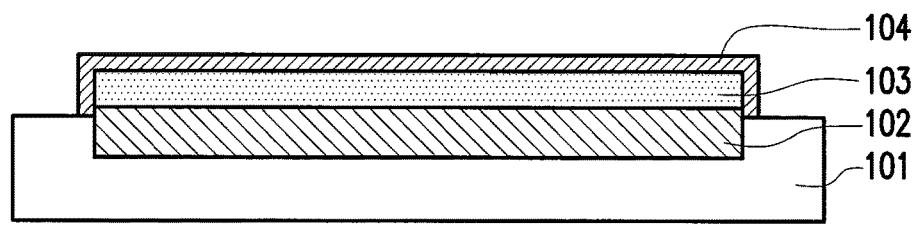
FIG. 1D illustrates forming a second protective layer on the first protective layer in accordance with an exemplary embodiment of the present disclosure.

Subsequent to the formation of the first protective layer 103, a second protective layer 104 would be disposed on the first protective layer 103 as illustrated by FIG. 1D. The second protective layer 104 could be disposed by applying a liquid solution which includes the thiol or thiol derivative as aforementioned to the first protective layer 103. For example, the liquid solution could be applied to the first protective layer 103 by dip coating the first protective layer 103 to the liquid solution to form the second protective layer 104. If the first metal layer 103 is a nickel layer, the liquid solution which includes the thiol compound would adhere well to nickel. The second protective layer 104 would be secured onto the first protective layer 103 simply by letting the recently dip coated second protective layer 104 sitting in a room temperature, or the second protective layer 104 could be put in an oven to expedite the forming process. The application of the second protective layer 104 as proposed would not require an additional step of applying a polymeric resin spray such as an epoxy. The second protective layer 104 would serve as a mask, barrier or cover to prevent the second metal layer from being disposed on un-intended locations of the first protective layer after the second protective layer 104 is patterned.

Figure 1E:
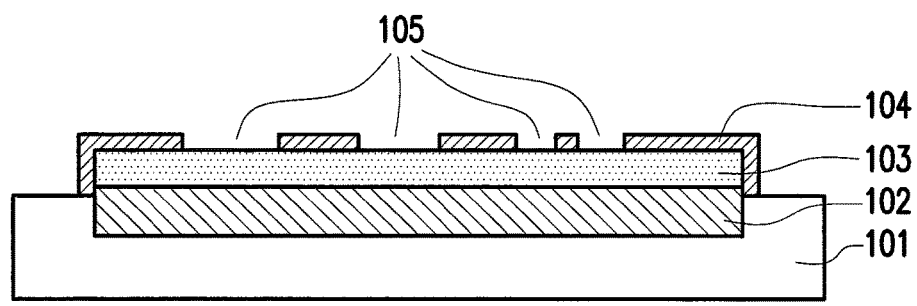
FIG. 1E illustrates patterning the second protective layer in accordance with an exemplary embodiment of the present disclosure.

FIG. 1E illustrates patterning the second protective layer 104 after the second protective layer 104 has been secured on the first protective layer 103 in accordance with an exemplary embodiment of the present disclosure. Since the thiol compound is sensitive to laser, a general laser could be applied to remove the pattern portion 105 of the second protective layer 104. The pattern portion 105 would include one or more openings through which a second metal layer could be disposed to be adhered to the first protective layer 103. This process step would replace a conventional technique using photolithography but would not require any masks and fixtures to pattern the second protective layer 104 as the pattern portion 105 would be formed by applying a laser beam to the pattern portion 105 to etch the second protective portion 104 exposed under the laser beam.

Figure 1F:
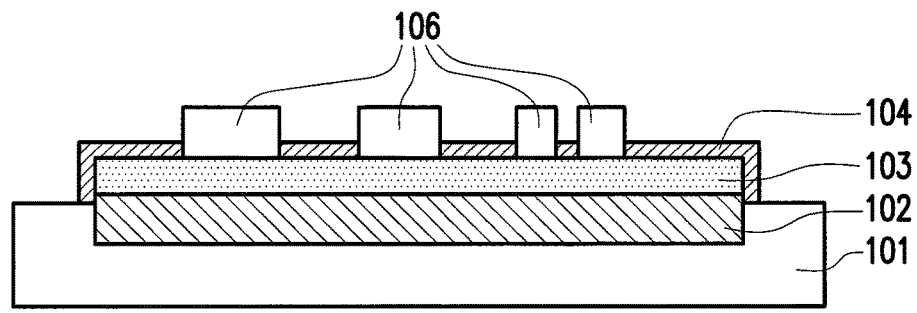
FIG. 1F illustrates forming the second metal layer in accordance with an exemplary embodiment of the present disclosure.

After the pattern portion 105 of the second protective layer 104 has been etched away by the application of laser, FIG. 1F illustrates a formation of the second metal layer 106 in accordance with an exemplary embodiment of the present disclosure. The second metal layer 106 would be formed by disposing the second metal layer 106 into the one or more openings shaped by the pattern portion 105. For example, the second metal layer 106 could be disposed into the one or more openings 105 on the first protective layer 103 by electroless plating. (i.e. by exposing the one or more openings of the second protective layer 104 to an electroless plating bath without the application of electrodes.) The second metal layer 106 could be, for example, gold. However, the material used for the second metal layer 106 could also be copper, silver, or any other highly conductive metal.

The substrate structure fabricated by the proposed method would include a base 101, a first metal layer 102 disposed on the base 101, a first protective layer 103 disposed on the first metal layer 102, a second protective layer 104 which is made of a chemical solution compound that includes a thiol compound disposed on the first protective layer 103, and a second metal layer 106 disposed on the first protective layer 103. The second protective layer 104 would include a pattern 105 which comprises one or more opening exposing the first protective layer 103. The second metal layer 106 would be disposed within the one or more openings and is disposed on the first protective layer 104.

Figure 2:
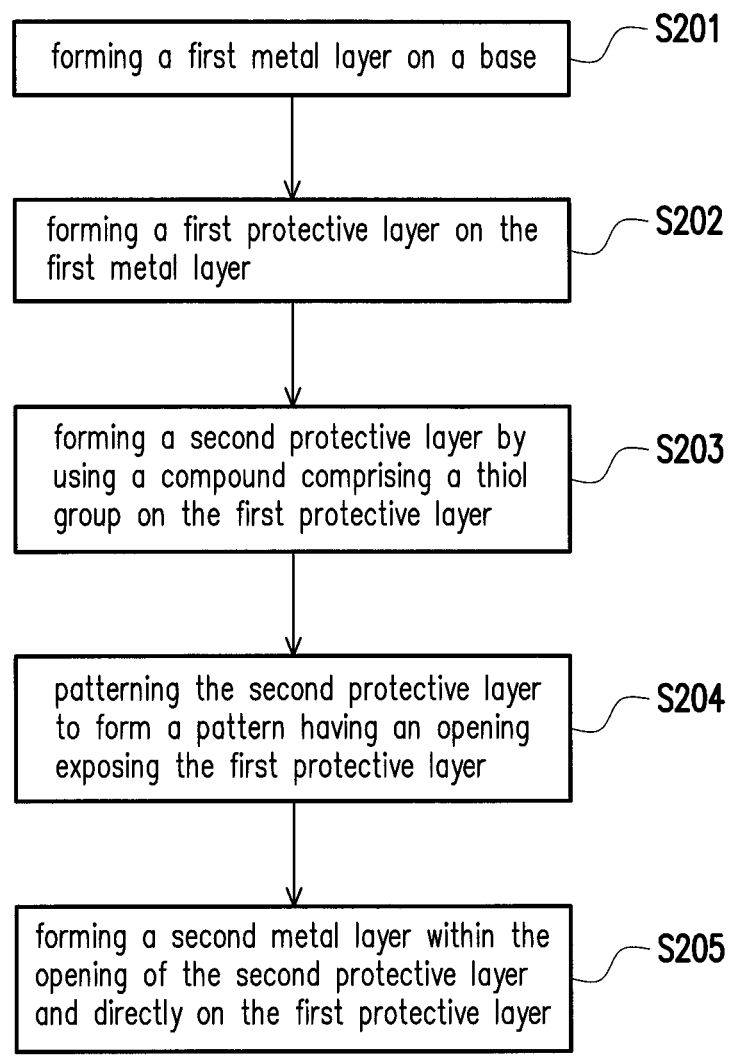
FIG. 2 illustrates a process of fabricating the substrate structure in accordance with an exemplary embodiment of the present disclosure.

FIG. 2 is a flow chart which summarizes the process of fabricating the substrate structure in accordance with an exemplary embodiment of the present disclosure. In step S201, a first metal layer is formed on a base. In step S202, a first protective layer is formed on the first metal layer. In step S203, a second protective layer is formed by using a chemical solution compound including a thiol group on the first protective layer. In step S204, the second protective layer is patterned to form a pattern having an opening exposing the first protective layer. In step S205, a second metal layer is formed within the opening of the second protective layer and is formed directly on the first protective layer.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

Moreover, the claims should not be read as limited to the described order or elements unless stated to that effect. In addition, use of the term "means" in any claim is intended to invoke 35 U.S.C. § 112, ¶6, and any claim without the word "means" is not so intended.

What is claimed is:

1. A method of fabricating a substrate structure comprising:
    forming a first metal layer directly on a base;
    forming a first protective layer directly on the first metal layer, so that the first protective layer is in direct contact with the first metal layer;
    forming a second protective layer by using a compound comprising a thiol group directly on the first protective layer, wherein the second protective layer physically contacts a top surface of the base;
    patterning the second protective layer to form a pattern having an opening exposing the first protective layer; and
    forming a second metal layer within the opening of the second protective layer and directly on the first protective layer, wherein the second protective layer covers a top surface and at least two opposite side surfaces of the first protective layer without covering a top surface of the second metal layer, and the second protective layer is laser sensitive and is capable of being etched by applying laser thereto, and
    wherein the second protective layer encircles the first metal layer and the first protective layer with the second metal layer and the base.

2. The method of claim 1, wherein the compound is selected from a group of Octadecanethiol, Nonanethiol, 1-Hexadecanethiol, 1-Butanethiol, tert-Nonyl mercaptan, Benzyl mercaptan, and Thiophenol.

3. The method of claim 1, wherein the step of forming the first metal layer directly on the base comprises:
    using laser to form a recess in the base; and
    disposing the first metal layer within the recess.

4. The method of claim 1, wherein the step of forming the second protective layer comprises:
applying a solution of the compound to the first protective layer.

5. The method of claim 1, wherein the step of patterning the second protective layer comprises etching the second protective layer with laser to form the pattern.

6. The method of claim 1, wherein a material of the first metal layer is copper or aluminium.

7. The method of claim 1, wherein the first protective layer is a diffusion barrier layer which prevents diffusion between the first metal layer and the second metal layer and prevents oxidation of the first metal layer.

8. The method of claim 7, wherein a material of the first protective layer is nickel or silver.

9. The method of claim 1, wherein the step of forming the first metal layer comprises forming the first metal layer directly on the base by using electroless plating.

10. The method of claim 1, wherein the step of forming the second metal layer comprises forming the second metal layer directly on the first protective layer by using electroless plating.

11. The method of claim 1, wherein the step of patterning the second protective layer is performed without a photomask.

12. The method of claim 1, wherein the step of forming the second protective layer is performed without spraying of polymeric resin.

13. A substrate structure comprising:
a base having a recess therein;
a first metal layer fitted in the recess of the base;
a first protective layer disposed on the first metal layer, wherein the first protective layer is in direct contact with the first metal layer;
a second protective layer comprising a thiol compound, wherein the second protective layer is disposed on the first protective layer and is laser sensitive, thereby the second protective layer being capable of being etched by applying laser thereto, and the second protective layer has a pattern which comprises an opening exposing the first protective layer; and
a second metal layer disposed within the opening of the second protective layer and disposed on the first protective layer, wherein the second protective layer covers a top surface and at least two opposite side surfaces of the first protective layer without covering a top surface of the second metal layer, and the second protective layer physically contacts a top surface of the base, thereby encircling the first metal layer and the first protective layer with the second metal layer and the base.

14. The substrate structure of claim 13, wherein the thiol compound is Octadecanethiol.

15. The substrate structure of claim 13, wherein the thiol compound is selected from a group of Nonanethiol, 1-Hexadecanethiol, 1-Butanethiol, tert-Nonyl mercaptan, Benzyl mercaptan, and Thiophenol.

16. The substrate structure of claim 13, wherein a material of the first metal layer is copper or aluminium.

17. The substrate structure of claim 13, wherein the first protective layer is a diffusion barrier layer which prevents diffusion between the first metal layer and the second metal layer and prevents oxidation.

18. The substrate structure of claim 17, wherein a material of the first protective layer is nickel or silver or chromium.

19. The substrate structure of claim 13, wherein a material of the base is polymer.

20. The substrate structure of claim 13, wherein a material of the second metal layer is gold.

* * * * *